(12) United States Patent
Horch et al.

(10) Patent No.: US 7,968,381 B1
(45) Date of Patent: Jun. 28, 2011

(54) FIN THYRISTOR-BASED SEMICONDUCTOR DEVICE

(75) Inventors: Andrew Horch, Sunnyvale, CA (US); Scott Robins, San Jose, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 712 days.

(21) Appl. No.: 11/581,316

(22) Filed: Oct. 16, 2006

Related U.S. Application Data

(62) Division of application No. 10/238,572, filed on Sep. 9, 2002, now Pat. No. 7,135,745.

(51) Int. Cl.
    *H01L 21/332* (2006.01)
(52) U.S. Cl. .............. 438/133; 257/107; 257/E29.216; 257/E29.225
(58) Field of Classification Search .......... 438/133; 257/107, E29.216, E29.225
    See application file for complete search history.

(56) References Cited

U.S. PATENT DOCUMENTS

| | | |
|---|---|---|
| 5,202,750 A | 4/1993 | Gough |
| 5,283,201 A | 2/1994 | Tsang et al. |
| 5,283,456 A | 2/1994 | Hsieh et al. |
| 5,324,673 A | 6/1994 | Fitch et al. |
| 5,338,945 A | 8/1994 | Baliga et al. |
| 5,340,759 A | 8/1994 | Hsieh et al. |
| 5,357,125 A | 10/1994 | Kumagi |
| 5,473,176 A | 12/1995 | Kakumoto |
| 5,612,559 A | 3/1997 | Park et al. |
| 5,637,898 A | 6/1997 | Baliga |
| 5,641,694 A | 6/1997 | Kenney |

(Continued)

FOREIGN PATENT DOCUMENTS
WO  WO 99/63598  12/1999

OTHER PUBLICATIONS

Digh Hisamoto, Wen-Chin Lee, et al; FinFET-A Self-Aligned Double-Gated MOSFET Scalable to 20 nm; Dec. 2000.

(Continued)

*Primary Examiner* — Matthew C Landau
*Assistant Examiner* — Vicki B Booker
(74) *Attorney, Agent, or Firm* — The Webostad Firm

(57) ABSTRACT

A semiconductor device having a thyristor-based device and a pass device exhibits characteristics that may include, for example, resistance to short channel effects that occur when conventional MOSFET devices are scaled smaller in connection with advancing technology. According to an example embodiment of the present invention, the semiconductor device includes a pass device having a channel in a fin portion over a semiconductor substrate, and a thyristor device coupled to the pass device. The fin has a top portion and a side portion and extends over the semiconductor substrate. The pass device includes source/drain regions separated by the channel and a gate facing and capacitively coupled to the side portion of the fin that includes the channel. The thyristor device includes anode and cathode end portions, each end portion having base and emitter regions, where one of the emitter regions is coupled to one of the source/drain regions of the pass device. The gate of the pass device is further adapted to switch the pass device between a blocking state and a conducting state via the capacitive coupling and form a conductive path between the source/drain regions. A control port is capacitively coupled to the base region of the end portion of the thyristor that is coupled to the source/drain region of the pass gate and is adapted to facilitate switching of the thyristor between blocking and conducting states.

3 Claims, 6 Drawing Sheets

U.S. PATENT DOCUMENTS

| | | | |
|---|---|---|---|
| 6,077,733 | A | 6/2000 | Chen et al. |
| 6,104,045 | A | 8/2000 | Forbes et al. |
| 6,225,165 | B1 | 5/2001 | Noble, Jr. et al. |
| 6,229,161 | B1 | 5/2001 | Nemati et al. |
| 6,462,359 | B1 | 10/2002 | Nemati et al. |
| 6,583,452 | B1 * | 6/2003 | Cho et al. ............ 257/107 |
| 7,285,804 | B2 * | 10/2007 | Quek et al. .......... 257/133 |
| 7,365,372 | B2 * | 4/2008 | Sugizaki ............. 257/122 |

OTHER PUBLICATIONS

Xuejue Huang, Wen-Chin Lee, et al; Sub 50-nm FinFET: PMOS, Sep. 1999.

Digh Hisamoto, Toru Kaga and Eiji Takeda; Impact of the Vertical SOI "DELTA" Structure on Planar Device Technology; Jun. 1991.

Farid Nemati, James D. Plummer; A Novel High Density, Low Voltage SRAM Cell with a Vertical NDR Device; VLSI Technology Digest, Jun. 1998.

Christopher J. Petti, James D. Plummer;The Field-Assisted Turn-Off Thyristor: A Regenerative Device with Voltage Control Turn-Off; Aug. 1992.

Farid Nemati, James D. Plummer; A Novel Thyristor-Based SRAM Cell(T-RAM) for High Speed, Low Voltage, Giga-Scale Memories; Intl Electron Devices Meeting Technical Digest, 1999.

* cited by examiner

FIN THYRISTOR-BASED SEMICONDUCTOR DEVICE

This is a divisional of patent application Ser. No. 10/238,572 filed Sep. 9, 2002 now U.S. Pat. No. 7,135,745, which is incorporated herein by reference.

FIELD OF THE INVENTION

The present invention is directed to semiconductor devices and, more specifically, to semiconductor devices employing thyristors.

BACKGROUND

Recent technological advances in the semiconductor industry have permitted dramatic increases in integrated circuit density and complexity, as well as equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the circuit design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price). DRAM cell size is typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

Thin capacitively-coupled thyristor-type NDR devices can be used to overcome these limitations in memory applications as well as other applications. However, another important design consideration in any type of thyristor-based semiconductor device, such as memory cells including thin capacitively-coupled thyristor-type NDR devices, is the inhibition of short channel effects. Short channel affects can present problems in the scaling (e.g., reduction in size and/or increase in density) of semiconductor devices, such as MOSFET devices. Specifically, as devices are scaled smaller, conductive channels used in transistors and other devices become shorter. As these channels become shorter, the operation of the scaled devices is affected. Two such short channel affects are leakage and mobility reduction due to high channel doping levels in short channel devices. These and other short channel effects can inhibit the ability to scale devices smaller while maintaining operational characteristics of the device.

These and other design considerations have presented challenges to the implementation of such a thin capacitively-coupled thyristor to bulk substrate applications, and in particular to applications where highly-dense arrays of thyristors are desirable.

SUMMARY

The present invention is directed to overcoming the above-mentioned challenges and others related to thyristor-based devices and applications, including the memory cells and others that are discussed above. The present invention is exemplified in a number of implementations and applications, some of which are summarized below.

According to an example embodiment of the present invention, a FINFET device is coupled in series with a thyristor for controlling access to the thyristor for storing data therein. The FINFET includes a thin silicon fin having a channel region therein, the channel region being disposed between source/drain regions, with a gate adapted for capacitively coupling to the channel region for controlling current flow therein. The thyristor includes a control port for capacitively coupling a signal for controlling current flow in the thyristor. With this approach, the channel region of the pass device can be made smaller while addressing needs including those associated with short channel and other effects, such as discussed above.

According to another example embodiment of the present invention, a semiconductor device includes a thyristor coupled to a pass device having a channel between source/drain regions, where the channel is part of a fin having a top portion and a side portion and extending over a semiconductor substrate. The pass device further includes a gate facing and adapted to capacitively couple to a side portion of the fin that includes the channel. In response to a voltage being applied to the gate, the gate is adapted to switch the channel between a blocking state and a conducting state (e.g., between high and low resistance states) for passing current between the source/drain regions. The thyristor includes anode and cathode end portions and is coupled in series to the pass device via one of the source/drain regions. Each end portion includes an emitter region and an adjacent base region, where the base regions are coupled between the emitter regions and one of the emitter regions is coupled to a source/drain region. A control port is adapted for capacitively coupling at least to one of the base regions for switching the thyristor between blocking and conducting states, for example, in memory applications in which data is stored at the emitter region coupled to the source/drain region of the pass device.

In a more particular example embodiment of the present invention, the fin discussed above also includes one or more regions of the thyristor. For example, in one implementation, the fin includes the base portion of the thyristor to which the control port is capacitively coupled. The control port faces one or more sides of the fin and capacitively couples to the fin via the one or more sides. In response to a voltage being applied to the control port, the thyristor is switched between low and high resistance states.

In another example embodiment of the present invention, a memory cell includes a pass device having a fin structure and coupled in series with a first emitter region of a thyristor. The fin structure includes a channel portion, such as the channel in the device discussed above, and a gate adapted to form a conductive channel in the fin for access to the first emitter region. The thyristor includes first and second base regions coupled between first and second emitter regions and adapted to store data at the first emitter region. When the pass device is in the conducting state, the first emitter region is coupled through the fin channel and made available, for example, for reading data (e.g., a voltage) stored at the first emitter region and/or for writing data to the first emitter region.

In another example embodiment of the present invention, a semiconductor device is manufactured having a thyristor electrically coupled to a pass device having a well portion formed in a thin fin. First, a thin fin having a top portion and a side portion is formed extending over a substrate. The pass device is formed having source/drain regions separated by a well region in the fin, and a control port capacitively coupled to the channel region. The control port is adapted to form a conductive channel in the well in response to a voltage being applied to the control port, the conductive channel electrically coupling the source/drain regions. The thyristor is formed adjacent to the pass device and having two end portions, each end portion having a base and an emitter region, the emitter regions being separated by the base regions. One of the emitter regions is electrically coupled to one of the source/drain regions of the pass device, and a thyristor control port is arranged to capacitively couple to the base region in the end portion including the emitter region coupled to the source/drain region. The thyristor control port is adapted to switch the thyristor between high and low resistance states by capacitively coupling a signal to a base region of the thyristor. In one particular implementation, one or more portions of the thyristor are formed in the fin, and in another implementation, one or more of the source/drain regions are formed in the fin.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1A:
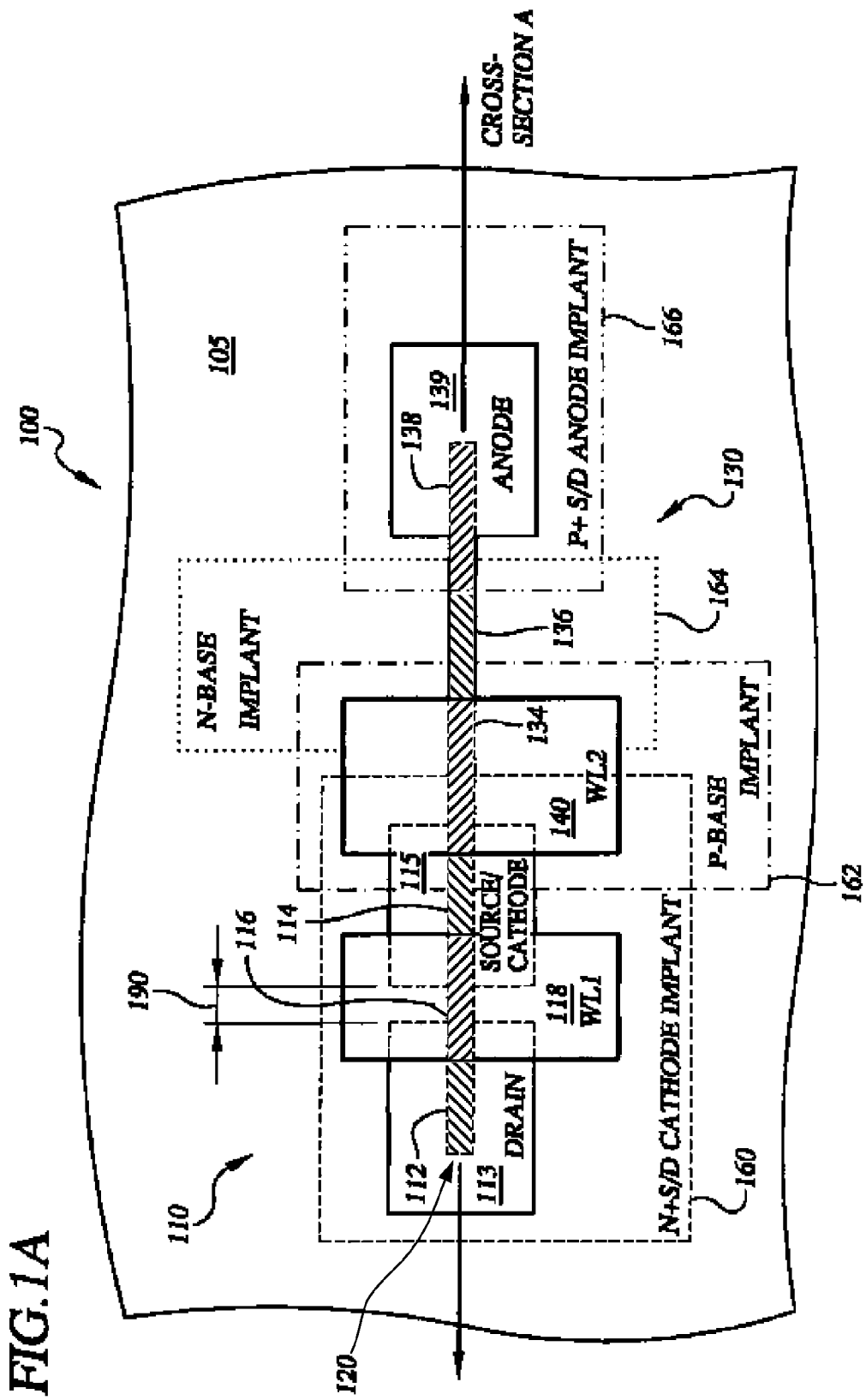
FIG. 1A is a thyristor-based semiconductor device having a fin adapted to inhibit short channel effects, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly useful for such devices benefiting from the inhibition of short channel effects, such as device used in high-density applications. While the present invention is not necessarily limited to such devices, various aspects of the invention may be appreciated through a discussion of various examples using this context.

According to an example embodiment of the present invention, a semiconductor device includes a thyristor coupled in series with a pass device having a gate capacitively coupled to a fin channel region that extends between two source/drain regions. The fin extends laterally over a substrate and has a thickness defined by two sidewalls. The gate is over and faces at least one of the sidewalls of the fin, and is adapted to switch the channel between blocking and conducting states for passing current between the source/drain regions. The thyristor includes anode and cathode end portions having base and emitter regions, the emitter portions being separated by the base portions. A control port is capacitively coupled to at least one of the base portions and is adapted to switch the thyristor between a blocking state and a conducting state for passing current between the emitters. In one particular implementation, the thyristor also includes part of the fin. The thyristor and pass device are adaptable for use in a variety of semiconductor device applications, such as for use as a memory storage cell.

The present invention can be implemented in a variety of configurations and arrangements. FIG. 1A shows one such arrangement including a memory cell 100 formed over a semiconductor substrate 105 using a double polysilicon deposition over a fin 120 (shown having dashed portions below other portions of the memory cell), according to a more particular example embodiment of the present invention. The memory cell includes a pass device 110 having drain region 112 and source region 114 separated by a P well channel region 116 in the fin 120, and a gate 118 capacitively coupled to the channel 116. A polysilicon drain contact 113 (e.g., for use as a contact to a bitline) and a polysilicon source contact 115 extend over at least a portion of the drain 112 and source 114 regions, respectively.

The memory cell 100 further includes a thyristor 130 having an N+cathode emitter 114, which is also used as the source region of the pass device 110, and a P+anode emitter 138. A P base region 134 and an N base region 136 separate the emitter regions, wherein each of the base and emitter regions include a portion of the fin, and a thyristor gate 140 is adapted to capacitively couple to the P base region. An anode polysilicon region 139 (e.g., a contact region to a local interconnect for coupling a reference voltage to the anode) is formed over the P+anode emitter region 138. The gate 140 is adapted to switch the thyristor between a blocking state and a conducting state, where the base regions form a conductive path between the emitter regions when in the conducting state. In one implementation, the gate 140 is formed extending over and facing at least one sidewall of the P base region 134 that is in the fin 120.

The source, drain, well, base and emitter regions of the memory cell can be formed in a variety of manners. For instance, FIG. 1A shows various example implantation regions, including N+ source/drain and cathode implant region 160, P base implant region 162, N base implant region 164 and P+ source/drain and anode implant region 166. In one implementation, the fin is formed and doped (e.g., using a photoresist mask) before one or more of the contact regions or gates are formed. The drain contact region 113, source contact region 115 and anode contact region 139 are formed over the doped fin using a single polysilicon deposition, and each of the contact regions is then doped to form electrical contact to portions of the fin over which they are formed. In another implementation, one or more of the contact regions is doped and the dopant therein is diffused into the fin to form source, drain and/or anode emitter regions in the fin. In still another implementation, the contact regions are deposited over the fin and portions of the fin below the contact regions are doped using a high-energy implant that implants dopants through the contact regions to the fin.

In still another implementation, one or more regions of the memory cell are formed using spacers around an existing layer (e.g., an etched polysilicon layer) to mask portions of a substrate when subsequently implanting the substrate over which the existing layer is disposed. For instance, using this approach, an N base region can be self-aligned to a sidewall of a control port over a substrate. More specifically, a control port is formed over a substrate and an N base implant is carried out using the control port to mask a portion of the substrate directly below the control port. After the N base implant, a spacer is formed on the substrate and laterally adjacent to the control port. Regions of the thyristor to be formed adjacent to the control port (e.g., the cathode and anode end portions) are then implanted using the spacer to mask the N base region. With this approach, the N base region is disposed in the substrate and self-aligned to a sidewall of the control port.

After the formation of the contact regions, a second polysilicon deposition is used to form the gate structures 118 and 140. In addition, in each of the implementations discussed above, one or more of the gate and contact regions may be used to mask portions of the fin and contact regions (in the case of the gates) during subsequent implementations. The gates are separated from the fin and the contact regions by an insulator, such as a gate dielectric, through which the gate is capacitively coupled to the P well region 116 (for gate 118) and the P base region 134 (for gate 140).

Figure 1B:
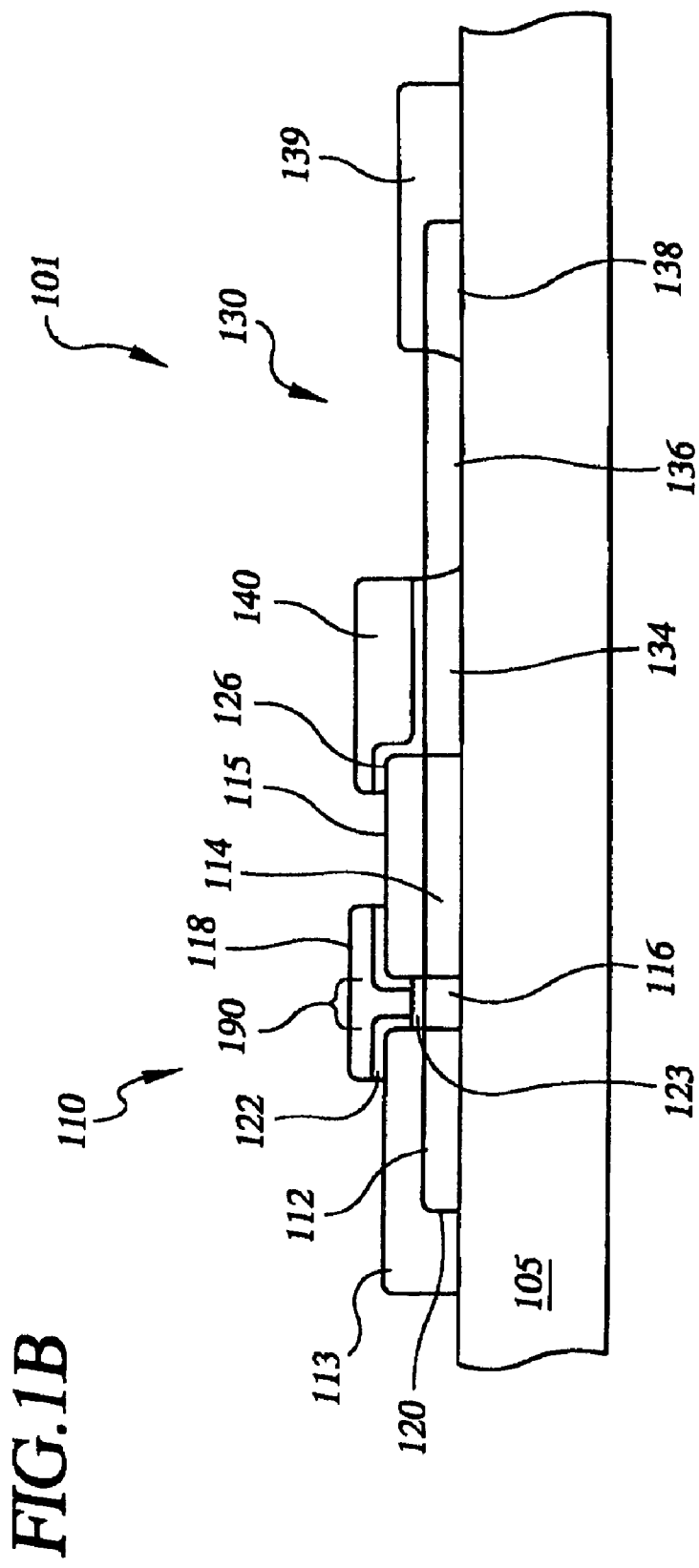
FIG. 1B is cross-sectional view of one implementation of the thyristor-based semiconductor device of FIG. 1A, according to a more particular example embodiment of the present invention.

FIG. 1B shows a cross-sectional view of the memory cell of FIG. 1A, according to another example embodiment of the present invention. In this example embodiment, gate spacer material 122 is formed over the drain contact 113 and source contact 115 regions, and a relatively thinner gate dielectric spacer material 123 is formed over the P well region 116 before the gate 118 is formed. In a similar manner, dielectric material 126 is formed over the contact 115 and P base region 134 before the gate 140 is formed. The spacer material 122 narrows the gap between the contact regions through which the gate extends. This approach is particularly useful, for example, for defining a width of gate 118 where it nears the P well region 116. Specifically, the source and drain contacts 113 and 115 can be formed in relatively limited steps using a single polysilicon deposition followed by a photoresist mask and etch to define opening 190. The spacer material 122 is then formed over the contacts 113 and 115, and in the opening 190. In addition, the N base region 136 can be formed after the gate 140 is deposited and self-aligned to the gate.

Figure 2:
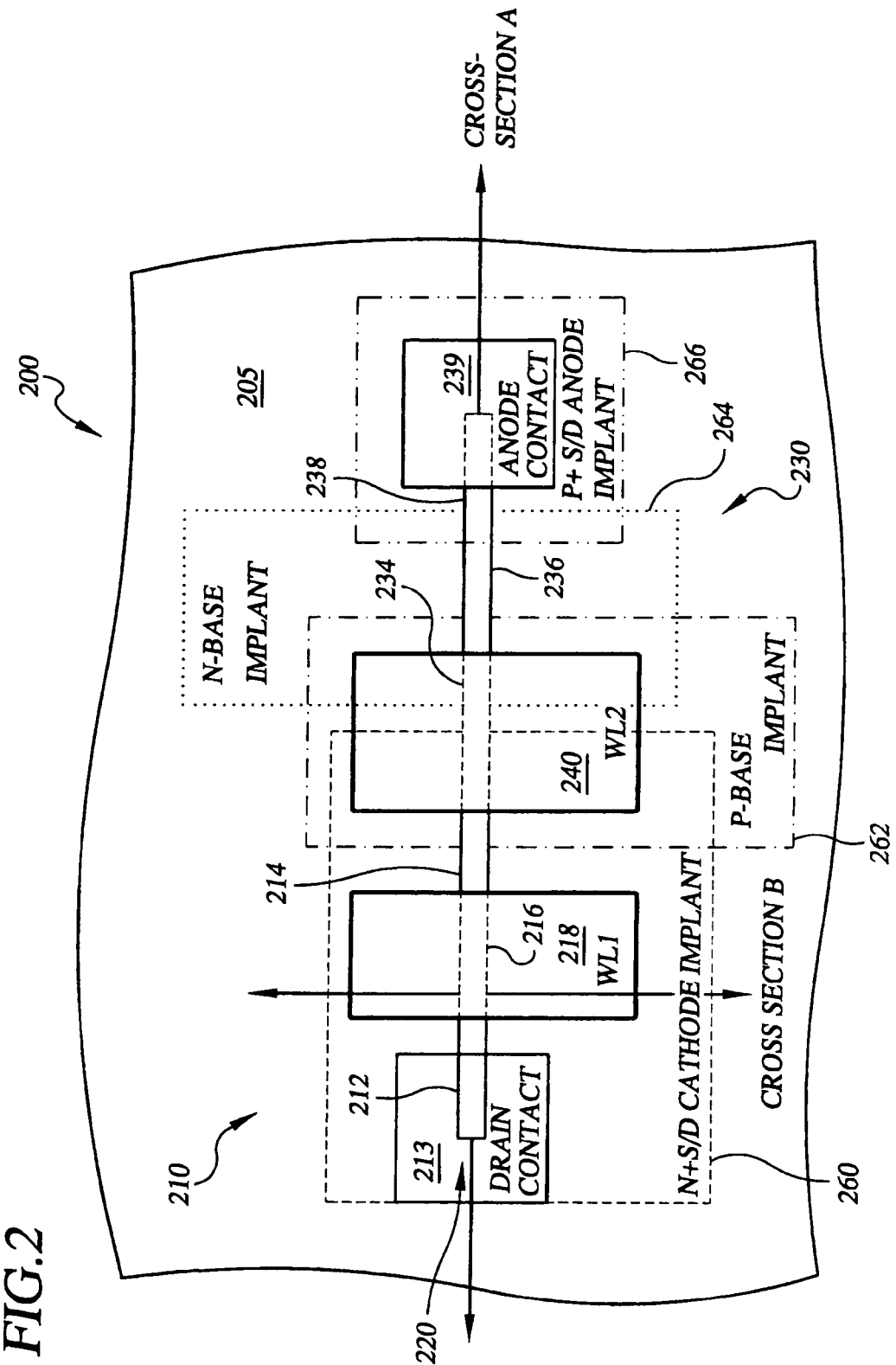
FIG. 2 is a thyristor-based semiconductor device having a fin adapted to inhibit short channel effects, according to another example embodiment of the present invention.

FIG. 2 shows a top-down view of a memory cell 200 formed over a substrate 205 using a single polysilicon deposition over a fin 220, according to another example embodiment of the present invention. The fin 220 is formed over the substrate 205, with P well region 216 and P base region 234 being implanted in the fin. Gates 218 and 240 are formed over the fin and separated from the fin by a gate dielectric. N base region 236 is located in a portion of the fin adjacent to the gate 240 (e.g., formed using a photoresist mask after polysilicon deposition, etch and subsequent implantation). N+ source/drain regions 212 and 214 are located on opposite sides of the gate 218 and having the P well region 216 separating them. The N+ source/drain regions may be formed, for example, using the gate 218 to mask the P well region 216 and the gate 240 to mask the P base region 234 during an N+ implant. A P+anode region 238 is located adjacent to the N base region 236 and may be formed, for example, using a photoresist mask and subsequent P+ implant. Drain contact 213 is formed over the drain region 212, and Anode contact 239 is located over the P+anode 238. In another implementation, the N base region is formed by self-aligning the N base to gate 240 using a sidewall spacer (not shown) around the gate 240 during subsequent implantation, such as discussed above.

The resulting memory cell in FIG. 2 includes fin pass device 210 having source/drain regions 212 and 214 separated by a P well channel region 216 and having a gate 218 over the P well. The gate 218 is adapted to effect a conductive channel in the P well region 216 between the source/drain regions 212 and 214 in response to a voltage being applied to the gate. The gate is coupled in series with a thyristor device 230 having N+emitter region 214 (shared as a source/drain region with the pass device 210), P base region 234, N base region 236 and P+cathode emitter region 238. The memory cell is adapted to receive and store information for use in a memory, such as by reading and/or writing "zero" and "one" values. In one implementation, the drain contact 213 is coupled to a bitline, the anode contact 239 is coupled to a local interconnect (e.g., carrying a reference voltage Vref) and gates 218 and 240 are coupled to word lines WL1 and WL2, respectively. In response to the word lines being pulsed and values at Vref and at the bitline, the memory cell 200 is adapted to work in connection with memory storage and retrieval operations.

The memory cell in FIG. 2 can be formed in a variety of manners, similar to those discussed above in connection with FIG. 1A. For instance, implantation regions labeled 260, 262, 264 and 266 may be used to implant similarly-numbered regions in FIG. 1A. In this regard, the fin portions can be doped before the polysilicon gate deposition, after the deposition using diffusion from a doped material over the fin, or doped through the polysilicon using a high-energy implant. In addition, other specific example embodiments are shown in FIGS. 3 and 5, which show cross-sectional views taken at cross-section A of FIG. 2, and FIG. 4, which shows a cross-sectional view taken at cross-section B of FIG. 2.

Figure 3:
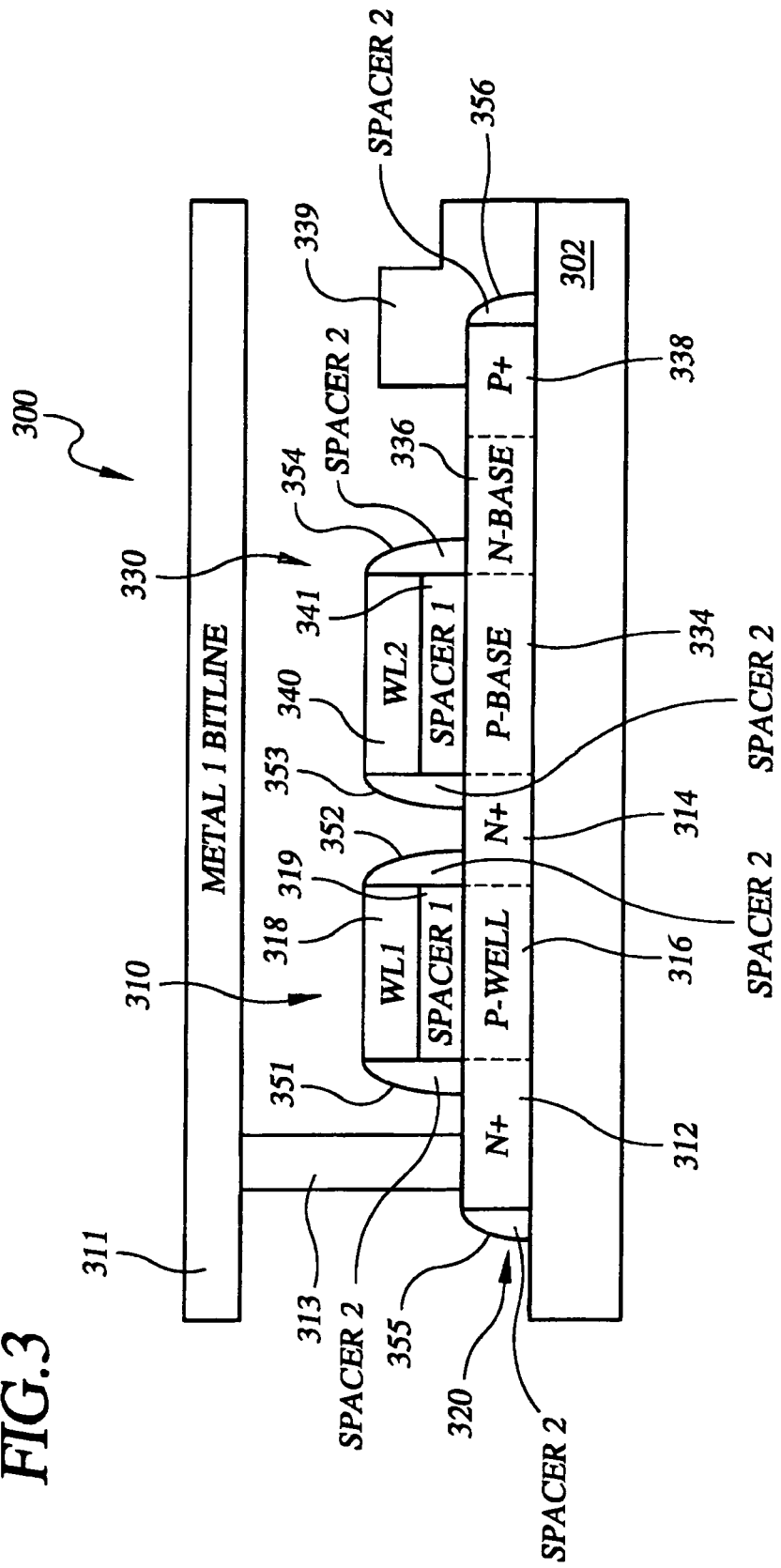
FIG. 3 is a cross-sectional view of a particular implementation of the thyristor-based semiconductor device shown in FIG. 2, according to another particular example embodiment of the present invention.

FIG. 3 shows a memory cell 300 having a thin fin 320 formed over a buried insulator 302, according to another example embodiment of the present invention. FIG. 3 is one example implementation of FIG. 2, as viewed along cross section A. The memory cell 300 includes a fin pass device 310 coupled in series to a thyristor 330 via an N+ region 314 that acts both as a source/drain region of the pass device and an N+cathode emitter region of the thyristor. The pass device 310 includes source/drain regions 312 and 314 that are separated by a P well channel region 316, and a gate electrode 318 arranged to capacitively couple to the P well channel region 316 via a gate dielectric 319. The thyristor includes N+ emitter region 314 and P+emitter region 338 separated by P base region 334 and N base region 336. A thyristor gate electrode 340 is arranged to capacitively couple to the P base region 334 via gate dielectric 341. The source/drain regions and P well regions of the pass device, as well as the base and emitter regions of the thyristor, are formed in the fin. Spacers are formed on sidewalls of the gates, control ports and of the end portions of the fin as shown, labeled 351, 352, 353, 354, 355 and 356.

The memory cell 300 is coupled to other circuitry in the device for read and write access to the N+ emitter region 314 via the N+ source/drain region 312. In this regard, the N+ source/drain region 312 is coupled to a metal contact 313 that is coupled to a Metal 1 bitline 311. The P+anode emitter region 338 is coupled to a local interconnect 339 (e.g., for supplying a reference voltage (Vref) signal). Each of the gate electrodes are coupled to a word line, where the pass device is coupled to a first wordline WL1 and the thyristor is coupled to a second wordline WL2. The memory cell is adapted to perform operations such as write and read "one" and "zero" data in response to pulses at WL1 and WL2 and a signal at the bit line. In an alternate implementation, the P+anode emitter region 338 is coupled to a Vref signal by extending the fin 320 to a Vref contact. In another alternate implementation, the local interconnect 339 is connected to another device interconnect (e.g., a metal1 interconnect) and bit lines are formed in yet another interconnect (e.g., a metal2 interconnect) or other configuration.

Generally, as described in the above-mentioned (U.S. Pat. No. 6,229,161), typical operation of the device memory cell 300 involves using an access controller (not shown) to provide appropriate control over the bit line 311, gate electrode 318 and thyristor gate electrode 340. For example, in standby mode, the bit line 311, WL1 and WL2 are inactive or at a low voltage level (which can be different for each line). For a write "Zero" operation, bit line 311 is raised to its high level and gate electrode 318 becomes active. This charges the level at the N+cathode emitter region 314 (used as a storage node) to a high voltage level and moves the thyristor 330 out of the strong forward biased region. A pulse is then applied to thyristor gate electrode 340. Capacitive coupling from the thyristor gate electrode 340 to the adjacent P base region 334 of the thyristor 330 results in an outflow of the minority charges from the middle N-doped region on the falling edge of the pulse applied to the thyristor gate electrode 340 and blocks current passing in the thyristor 330. The thyristor 330 is sufficiently thin so that the thyristor gate electrode 340 has tight control on the potential across the body of the thyristor 330 (e.g., across the P base region 334), and can modulate this potential via the capacitive coupling. The thyristor 330 is switched to the blocking state after this operation.

For a write "One" operation, the voltage level of the bit line 311 is held low. After the gate electrode 318 is raised to its high level, a pulse is applied to the thyristor gate electrode 340. The rising edge of this pulse raises the potential of the P base region 334 via capacitive coupling and makes the PN and NP junctions forward biased which, in-turn, starts the well-known regenerative process in the PNPN thyristor construction and the thyristor 330 transitions to its forward conducting state. After completing such an operation, control over the bit line 311 and word lines coupled to gate electrode 340 and thyristor gate electrode 340 typically changes to effect the standby mode in which a current path through the fin pass device 310 is blocked.

Figure 4:
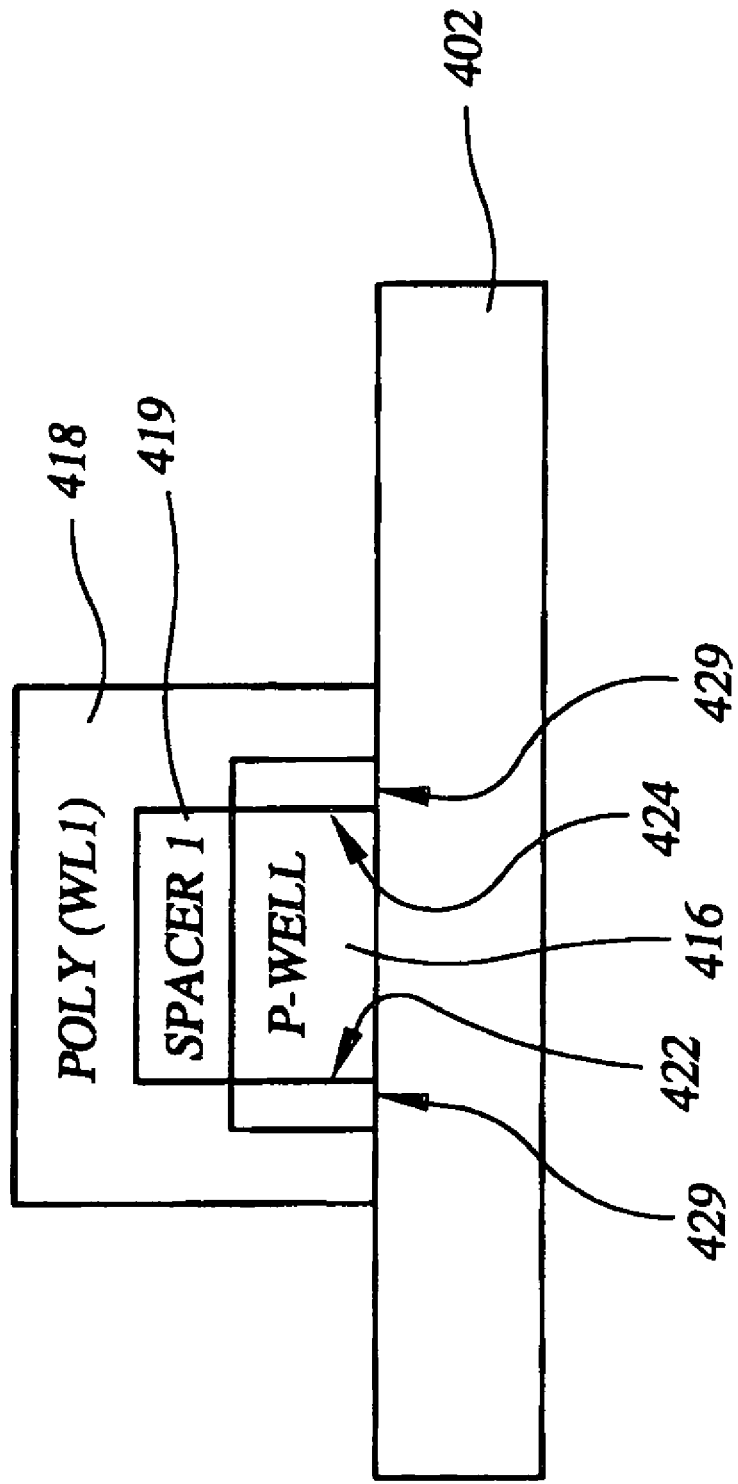
FIG. 4 is a cross-sectional view of another implementation of the thyristor-based semiconductor device shown in FIG. 2, according to another particular example embodiment of the present invention.
Figure 5:
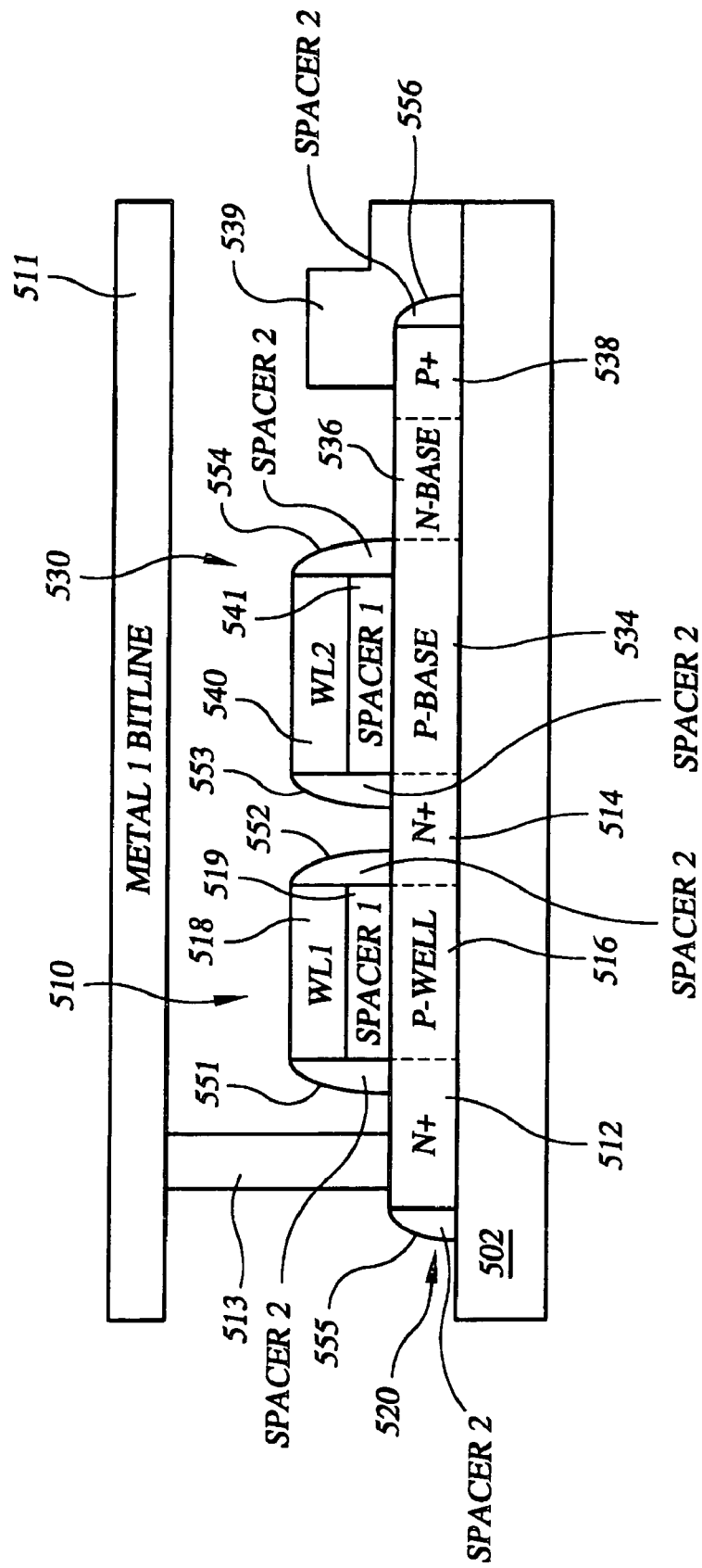
FIG. 5 is a cross-sectional view of another implementation of the thyristor-based semiconductor device shown in FIG. 2, according to another particular example embodiment of the present invention.

FIG. 4 shows a gate electrode 418 formed over and adjacent to sidewalls 422 and 424 of a P well region 416 in a fin, according to another example embodiment of the present invention. The structure in FIG. 4 is applicable, for example, to the memory cells in FIGS. 2 and 3 as discussed above, and in FIG. 5 as discussed below. The P well region 416 is formed as part of a fin extending over an insulator region 402, and a gate spacer material 419 is formed over the P well region. Gate dielectric material 429 is formed on the sidewalls 422 and 424, and the gate electrode 418 is capacitively coupled to the P well region via the gate spacer and dielectric materials 419 and 429. In one manufacturing implementation, the spacer material 419 is used as an etch stop layer during polysilicon etch (e.g., for the gate electrode 418). With this approach, capacitive coupling from the gate electrode 418 to the P well region 416 along the top of the fin can be reduced. This approach is particularly useful, for example, for limiting capacitive coupling along sidewalls of the fin.

Referring to both FIG. 3 and FIG. 4, the fin is formed having a length defined by the extent of the N+ source/drain region 312 and extending to the end of the P+ anode emitter region 338. The height of the fin is as shown in both FIGS. 3 and 4, and the width of the fin is defined by the width of the P well region shown in FIG. 4 (e.g., as taken at cross section B in FIG. 2). In a more particular example embodiment of the present invention, the thyristor gate 340 is also formed in a similar manner to the pass device gate in FIG. 4, wherein the thyristor gate is formed over and adjacent to sidewalls of the P base region 334.

FIG. 5 shows another memory cell 500, according to another example embodiment of the present invention. Articles in FIG. 5 that are similar to those shown in FIG. 3 are similarly labeled, with certain discussion thereof omitted for brevity. The memory cell in FIG. 5 is similar to the memory cell in FIG. 3, but having larger spacers and an N base region 536 self-aligned to a spacer 554. This approach is useful, for example, because the N base region 536 can be self-aligned to the P base region, thereby reducing and/or eliminating variation that may be present using, for example, photolithography alone for defining the extents of the N and P base regions. As discussed above in connection with FIGS. 3 and 4, the gate 518 is formed over and adjacent sidewalls of the P well portion 516 of the fin 502.

According to another embodiment of the present invention, a semiconductor device includes an array of memory cells and a control circuit configured and arranged to control read and write access to one or more selected cells in the array. The array includes one or more memory cells and/or devices having a fin structure and an NDR device, such as discussed herein. Each cell has a storage node, a capacitively-switched NDR device configured and arranged to enhance writing to the storage node and an access circuit configured and arranged to couple data between the storage node and the control circuit.

According to yet another embodiment of the present invention, a semiconductor device includes a power switch structure including one or more fin structures and an NDR device, such as discussed herein. The power switch structure includes a plurality of combination NDR device and control-port circuits. Each NDR device has at least two contiguous regions of opposite polarity, and the associated control port is located adjacent to and facing at least one of the regions of the NDR device. The at least one of the regions of the NDR device has a cross-section along a plane facing an interface between two of the contiguous regions, and the control port and the NDR device are configured and arranged so that the potential across the entire cross-section changes in response to a control voltage presented to the control port.

For general information regarding FinFET devices and for specific information regarding approaches that may be implemented in connection with the present invention, reference may be made to "FinFET—A Self-Aligned Double-Gate MOSFET Scaleable to 20 nm" in IEEE Transactions on Electron Devices, Vol. 47, No. 12, December 2000, which is fully incorporated herein by reference. In addition, reference may also be made to U.S. Pat. No. 6,229,161, which is fully incorporated herein by reference, for information regarding semiconductor devices in general and for specific information regarding to the use of a FET in combination with an NDR device, such as a thyristor.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor; coupling the pass devices to the P+ anode end portion of a thyristor and interchanging P and N regions in the device structures and/or using PMOSFETS rather than NMOSFETS. Such modifications and changes do not depart from the true spirit and scope of the present invention that is set forth in the following claims.

What is claimed is:

1. A method of manufacturing a semiconductor device having a semiconductor substrate, the method comprising:
   forming a fin having a top portion and a side portion extending over the semiconductor substrate;
   forming a pass device comprising a channel between source/drain regions, wherein the fin includes at least a portion of the channel, the pass device further comprising a gate facing and capacitively coupled to a side portion of the fin that includes the channel;
   forming a thyristor having anode and cathode end portions, each end portion including an emitter region and an adjacent base region, the adjacent-base regions being coupled to each other and located between the emitter regions, one of the emitter regions being coupled to one of the source/drain regions of the pass device;
   forming at least one control port proximate to at least one of the adjacent-base regions;
   wherein forming the thyristor comprises:
      doping to form an N-base region which in turn dopes a first portion of the fin;
      doping to form a P+ emitter region adjacent to the N-base region which in turn dopes a second portion of the fin;
      doping to form a P-base region adjacent to the N-base region which in turn dopes a third portion of the fin; and
      doping to form an N+ emitter region adjacent to the P-base region which in turn dopes a fourth portion of the fin, wherein the N-base region and the P-base region comprise the adjacent-base regions; and
   wherein the forming of the pass device includes forming a polysilicon layer over the fin to form source/drain contact regions.

2. A method for manufacturing a semiconductor device, comprising:
   forming a semiconductor fin on a substrate;
   forming a first base region which includes implanting into a first portion of the semiconductor fin;
   forming a gate dielectric over the first portion of the semiconductor fin;
   forming a gate conductor over the gate dielectric;
   forming a second base region which includes implanting into a second portion of the semiconductor fin, the second portion of the semiconductor fin being adjacent to the first portion of the semiconductor fin;
   forming a first emitter region which includes implanting into a third portion of the semiconductor fin adjacent to the first portion of the semiconductor fin; and
   forming a second emitter region which includes implanting into a fourth portion of the semiconductor fin adjacent to the second portion of the semiconductor fin;
   wherein the first portion, the second portion, the third portion, the fourth portion, the gate dielectric, and the gate conductor in combination provide a thyristor-based memory cell;
   wherein the forming of the first emitter region includes forming a first source/drain region and a second source/drain region of a transistor.

3. The method according to claim 2, wherein the first portion, the second portion, the third portion, the fourth portion respectively are a p-base, an n-base, a cathode, and an anode.

* * * * *